(12) United States Patent
Belyansky et al.

(10) Patent No.: US 7,618,853 B2
(45) Date of Patent: Nov. 17, 2009

(54) FIELD EFFECT TRANSISTORS WITH DIELECTRIC SOURCE DRAIN HALO REGIONS AND REDUCED MILLER CAPACITANCE

(75) Inventors: Michael P. Belyansky, Bethel, CT (US); Dureseti Chidambarrao, Weston, CT (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 11/865,313

(22) Filed: Oct. 1, 2007

(65) Prior Publication Data

US 2008/0020522 A1 Jan. 24, 2008

Related U.S. Application Data

(62) Division of application No. 11/306,710, filed on Jan. 9, 2006, now Pat. No. 7,342,266.

(51) Int. Cl.
*H01L 21/336* (2006.01)
*H01L 21/8234* (2006.01)

(52) U.S. Cl. .................. 438/197; 438/311; 438/954; 257/E21.17; 257/E21.051; 257/E21.218; 257/E21.227; 257/E21.229; 257/E21.32; 257/E21.267; 257/E21.435

(58) Field of Classification Search ............ 438/197, 438/311, 199, 289, 300, 301, 680, 706, 712, 438/23, 756, 743, 663, 657, 780, 954
See application file for complete search history.

(56) References Cited

U.S. PATENT DOCUMENTS

| | | | |
|---|---|---|---|
| 5,320,974 A | 6/1994 | Hori et al. | |
| 5,759,901 A | 6/1998 | Loh et al. | |
| 6,083,796 A | 7/2000 | Park et al. | |
| 6,255,174 B1 | 7/2001 | Yu | |
| 6,346,729 B1 | 2/2002 | Liang et al. | |
| 6,368,926 B1 | 4/2002 | Wu | |
| 6,448,613 B1 | 9/2002 | Yu | |
| 6,483,158 B1 * | 11/2002 | Lee | 257/408 |
| 6,573,560 B2 | 6/2003 | Shenoy | |
| 6,743,685 B1 | 6/2004 | Wu et al. | |
| 6,812,103 B2 * | 11/2004 | Wang et al. | 438/300 |
| 6,870,220 B2 | 3/2005 | Kocon et al. | |
| 7,342,266 B2 * | 3/2008 | Belyansky et al. | 257/288 |
| 2005/0116298 A1 | 6/2005 | Tihanyi | |

* cited by examiner

*Primary Examiner*—David Nhu
(74) *Attorney, Agent, or Firm*—Cantor Colburn LLP; H. Daniel Schnurmann

(57) ABSTRACT

A field effect transistor (FET) device includes a gate conductor and gate dielectric formed over an active device area of a semiconductor substrate. A drain region is formed in the active device area of the semiconductor substrate, on one side of the gate conductor, and a source region is formed in the active device area of the semiconductor substrate, on an opposite side of the gate conductor. A dielectric halo or plug is formed in the active area of said semiconductor substrate, the dielectric halo or plug disposed in contact between the drain region and a body region, and in contact between the source region and the body region.

5 Claims, 8 Drawing Sheets

FIELD EFFECT TRANSISTORS WITH DIELECTRIC SOURCE DRAIN HALO REGIONS AND REDUCED MILLER CAPACITANCE

CROSS REFERENCE TO RELATED APPLICATION

This application is a divisional application of U.S. Ser. No. 11/306,710, filed Jan. 9, 2006, the contents of which are incorporated by reference herein in their entirety.

BACKGROUND

The present invention relates generally to semiconductor device processing techniques, and, more particularly, to a structure and method for reducing short channel effects and parasitic capacitances in field effect transistors (FETs).

In the manufacture of semiconductor devices, there is a constant drive to increase the operating speed of certain integrated circuit devices such as microprocessors, memory devices, and the like. This drive is fueled by consumer demand for computers and other electronic devices that operate at increasingly greater speeds. As a result of the demand for increased speed, there has been a continual reduction in the size of semiconductor devices, such as transistors. For example, in a device such as a field effect transistor (FET), device parameters such as channel length, junction depth, gate dielectric thickness, and operating voltage, to name a few, all continue to be scaled downward.

Generally speaking, the smaller the FET, the faster the transistor will operate. While the interdependence of circuit switching speed on the transistor parameters is complex, the switching speed is typically benchmarked using the CV/I figure of merit, where C is the circuit load capacitance, V is the operating voltage, and I is the transistor effective "on" current during a switching event. The smaller the CV/I factor, the faster the switching speed will be. Typically, smaller FETs exhibit reduced operating voltage, similar or larger effective switching current, and similar or reduced parasitic capacitance, and, consequently, an increased switching performance. Moreover, by reducing the size and/or scale of the components of a typical transistor, there is also an increase in the density and number of the transistors that may be produced on a given amount of wafer real estate, thus lowering the overall cost per transistor as well as the cost of integrated circuit devices incorporating such transistors.

Unfortunately, reducing the channel length of a transistor also increases "short channel" effects, as well as "edge effects" that are relatively unimportant in long channel transistors. One example of a short channel effect includes, among other aspects, an increased drain to source leakage current when the transistor is supposed to be in the "off" or non-conductive state, due to an enlarged drain-to-body and source-to-body junction depletion region relative to the shorter channel length. In addition, one of the edge effects that may also adversely influence transistor performance is the gate-to-source/drain capacitance. A part of this parasitic fringe capacitance can be effectively increased via transistor gain factor, and is known as Miller capacitance. In CMOS applications, the Miller capacitance is an amplification of a gate to drain capacitance.

The gate-to-source/drain capacitance typically includes several distinct components: direct overlap ($C_{do}$), outer fringe ($C_{of}$), inner fringe ($C_{if}$), and gate-to-contact stud ($C_{stud}$). The first three components are often cumulatively referred to as overlap capacitance ($C_{ov}$). Direct overlap capacitance exists primarily as a result of the gate electrode and gate dielectric that (almost invariably) overlaps with a conductive portion of the source/drain regions and/or the source/drain extension (SDE) regions (if present) of the FET. The outer fringe capacitance is typically a corner capacitance between more vertically oriented gate conductor wall and more horizontally oriented source/drain surface separated by dielectric spacers. The inner fringe capacitance is also a corner capacitance between more horizontally oriented gate electrode interface adjacent to the gate dielectric and more vertically oriented source/drain junction adjacent to the transistor body. In the case of inner fringe capacitance, the conductive surfaces are separated by thin gate dielectric and depleted transistor body. The relative contribution of the overlap capacitance to the overall device capacitance increases as the gate length is scaled down. For example, $C_{ov}$ can account for as much as 50% of the overall capacitance when a MOSFET has a scaled gate length of about 30 nanometers.

Accordingly, it would be desirable to be able to fabricate an FET that maintains a low series resistance between the channel and the drain and between the channel and the source of the device, while at the same time retaining beneficially reduced short channel effects and minimizing the parasitic capacitances of the device including the Miller capacitance between drain and gate, the source-to-gate capacitance, and the junction capacitances formed between source/drain regions and transistor body, depending on the device application.

SUMMARY

The foregoing discussed drawbacks and deficiencies of the prior art are overcome or alleviated by a field effect transistor (FET) device including a gate conductor and gate dielectric formed over an active device area of a semiconductor substrate. A drain region is formed in the active device area of the semiconductor substrate, on one side of the gate conductor, and a source region is formed in the active device area of the semiconductor substrate, on an opposite side of the gate conductor. A dielectric halo is formed in the active area of said semiconductor substrate, the dielectric halo disposed in contact between the drain region and a body region, and in contact between the source region and the body region.

In another embodiment, a method for forming a field effect transistor (FET) device includes forming a gate conductor and gate dielectric on an active device area of a semiconductor substrate, forming a drain region in the active device area of said semiconductor substrate, on one side of the gate conductor, and forming a source region in the active device area of said semiconductor substrate, on an opposite side of said gate conductor. In addition, a dielectric halo is formed in the active area of the semiconductor substrate, the dielectric halo disposed in contact between the drain region and a body region and in contact between the source region and the body region.

BRIEF DESCRIPTION OF THE DRAWINGS

Referring to the exemplary drawings wherein like elements are numbered alike in the several Figures.

DETAILED DESCRIPTION

Disclosed herein is a method and structure for reducing parasitic capacitances such as a Miller capacitance in field effect transistors (FETs), in which a dielectric material is integrated just below the source/drain extension regions, across the entire width of the device on both the source and drain sides. Thereby, a dielectric plug or "halo" is created to minimize parasitic capacitances by further reducing the magnitude of the junction capacitance component and the inner fringe component of source-to-gate and source-to-drain (Miller) capacitance. Further, the present configuration reduces the amount of depletion charge in the transistor body controlled or induced by drain bias, thus reducing highly undesirable short channel effects. Moreover, the present configuration accomplishes this without increasing the series resistance of the device, degrading channel mobility, and increasing the outer fringe capacitance such as would be the case for a raised source/drain configuration, as described hereinafter.

Figure 1:
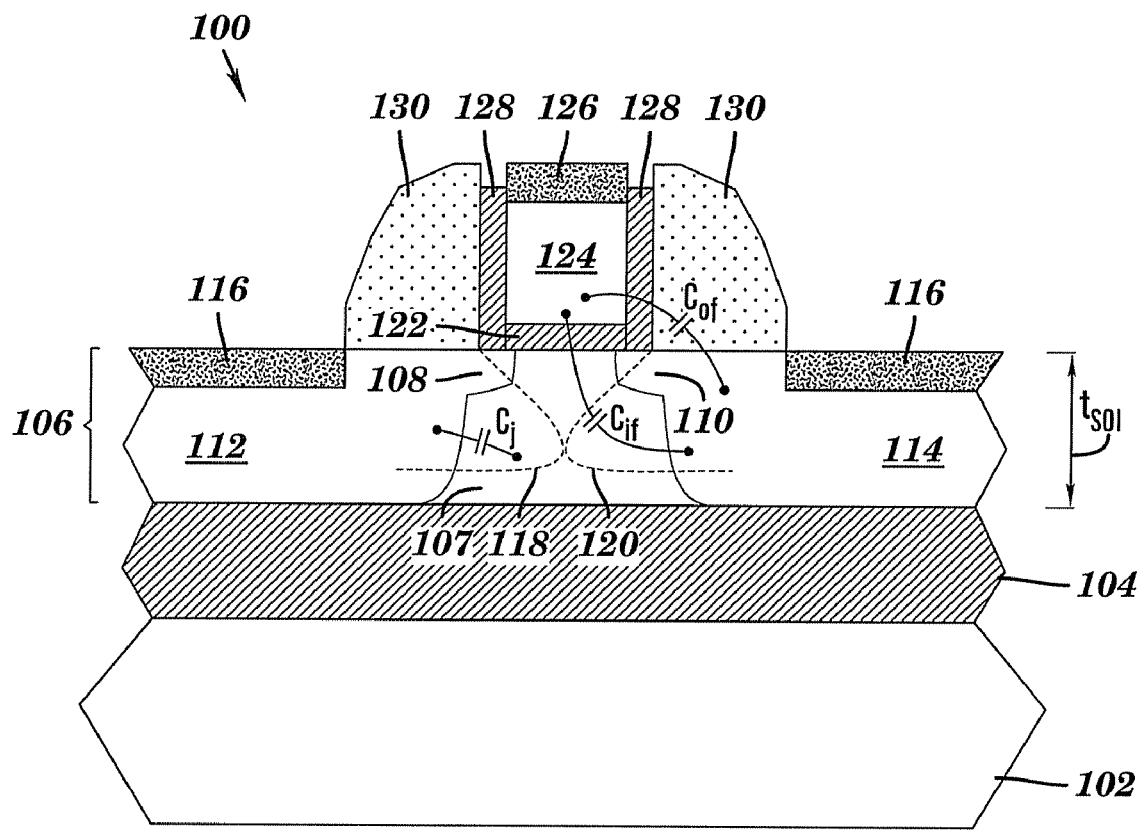
FIG. 1 is a cross sectional view of a conventionally formed MOS transistor schematically illustrating various components of parasitic capacitance.

Referring initially to FIG. 1, there is shown a cross sectional view of one type of conventional silicon-on-insulator (SOI) MOS transistor 100, in which a bulk substrate 102 (e.g., silicon) has a buried oxide layer (BOX) 104 formed thereon. Formed over the BOX layer 104 is a thin layer of silicon 106 (i.e., the SOI layer) in which the active transistor device is defined. As is known in the art, one advantage associated with SOI devices is reduced junction capacitance, as the majority of the bulk silicon is isolated from the conductive source/drain regions 112/114 of the transistor through the thick BOX layer 104 (typically 100-300 nm thick).

The scaled down MOSFET 100, having submicron or nanometer dimensions, includes a source extension 108 and a drain extension 110 formed within an active device area of the SOI layer 106. For this particular configuration of SOI FET, the total thickness of the SOI layer 106 ($t_{SOI}$) may be on the order of about 20 nanometers (nm) to about 150 nm. The source extension 108 and the drain extension 110 are shallow doped junctions designed to minimize short channel effects in the MOSFET 100 having submicron or nanometer dimensions, as known to one of ordinary skill in the art of integrated circuit fabrication.

The MOSFET 100 further includes a deep source doping region 112 and a deep drain doping region 114, each having silicide regions 116 for providing contact to the source and drain of the MOSFET 100. In most MOSFET structures, the designation of certain regions as "source" as opposed to "drain" (or the reverse) is arbitrary and depends solely on the transistor biasing scheme which, in turn, may repeatedly change during the course of transistor operation in a particular circuit. In addition, the SOI MOSFET 100 may include angled halo implant regions 118, 120 on the source and drain sides of the device (for further reducing short channel effects), wherein the halo implant regions have an opposite polarity dopant with respect to the deep source and drain regions 112, 114. In other words, for an n-type transistor, the deep source and drain regions are doped with an n-type dopant, while the halo implants comprise a p-type dopant.

As further illustrated in FIG. 1, MOSFET 100 includes a gate dielectric 122 (e.g., an oxide) and a gate structure 124 formed thereon, which may be a polysilicon material, for example. As is the case with the source and drain regions, a gate silicide 126 is formed on the polysilicon gate 124 for providing a low resistance contact thereto. A thin spacer 128 is also disposed on the sidewalls of the polysilicon gate 124 and gate oxide 122, and may also be an oxide material that acts as a buffer liner for nitride spacers 130. In addition, various mechanical stressors (not shown) can be incorporated into the source and drain regions 112, 114 in order to improve the channel electrical transport by mechanically straining the transistor body 107 in the proximity of the channel.

In such a device, parasitic capacitance components are present. For example, in a typical CMOS application, the gate to drain capacitance is typically amplified with respect to the gate to source capacitance due to the Miller effect since the source potential is generally fixed (e.g., an NFET source coupled to a logic low potential, and a PFET source coupled to a logic high potential). On the other hand, the voltage of the drain of a CMOS device is also subject to change at the same time the gate voltage changes, thus resulting in the amplified Miller effect. As shown in FIG. 1, one component of the overall gate to drain capacitance results from the "outer fringe" capacitance ($C_{of}$) defined by the sidewall of the gate conductor 124 on the drain side, the dielectric of the spacer material 128, 130, and the drain extension 110.

In addition, an "inner fringe" capacitance ($C_{if}$) is defined by the bottom of the gate conductor 124, the transistor body 107, and the deep drain region 114. However, this component of parasitic capacitance is primarily present at gate voltages less than or equal to the threshold voltage ($V_T$) of the device. Once the gate voltage reaches and exceeds $V_T$, the inversion charge in the channel isolates the body and deep drain region from the gate 124, rendering $C_{if}$ mostly insignificant. Another component of gate to drain capacitance is the direct overlap capacitance ($C_{od}$) (not shown in FIG. 1) of the drain extension region 110 beneath the gate conductor 124 and gate oxide 122, as indicated above.

Still another component that can contribute to gate to drain capacitance results from via studs (not shown) that connect the silicide contacts 116 to upper wiring levels of the device. The same capacitive components also exist on the source side of the transistor resulting in the source-to-gate parasitic capacitance. While the source-to-gate parasitic capacitance is not typically amplified by the Miller effect (due to a fixed source bias as alluded to above), it also constitutes a substantial portion of the overall parasitic capacitance of an FET.

On the whole, the individual components of gate to drain capacitance (and thus Miller capacitance for a CMOS application) and gate to source capacitance of the MOSFET 100 of FIG. 1 generally result in a slow switching speed. On the other hand, improved short channel effects for a scaled down device of the type shown in FIG. 1 are more likely realized through, for example, halo implants 118, 120. However, a higher dopant concentration of the halo implants will increase the junction capacitance, shift transistor threshold voltage to a higher absolute value, and reduce the breakdown voltage of the device.

Figure 2:
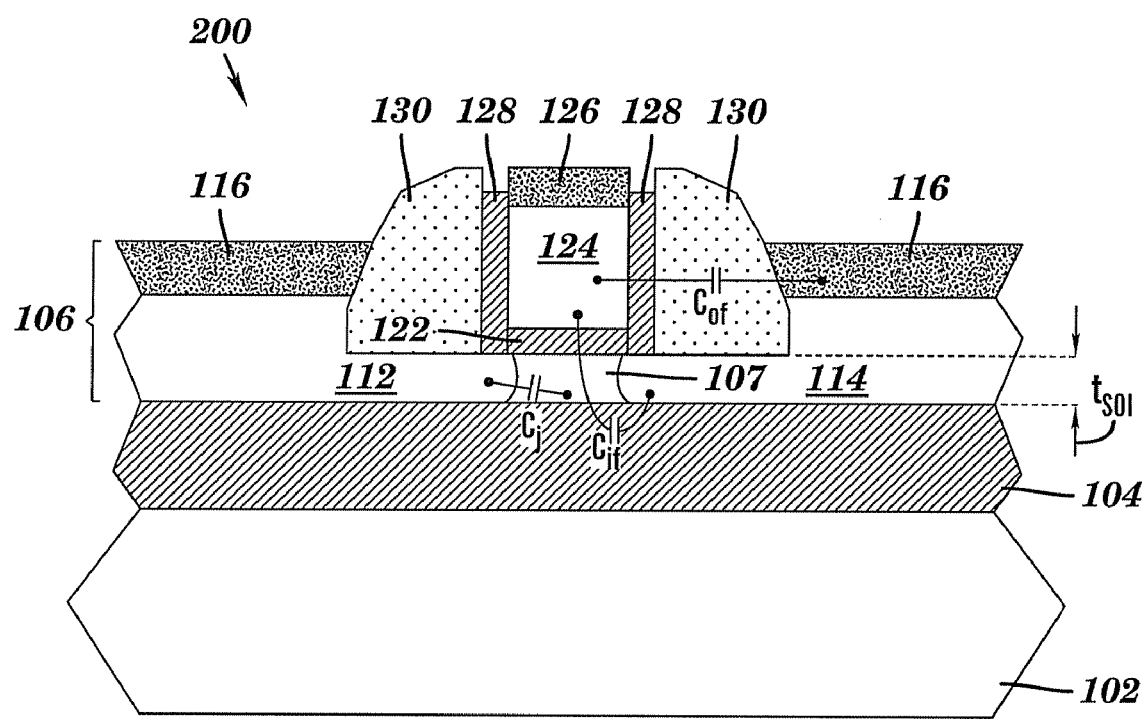
FIG. 2 is a cross sectional view of an alternatively proposed, ultra thin SOI MOS transistor schematically illustrating various components of parasitic capacitance.

Accordingly, FIG. 2 is a cross sectional view of another previously proposed SOI MOSFET design 200, aimed at improving short channel effects. As can be seen, the MOSFET 200 of FIG. 2 is characterized by an ultra thin SOI body thickness (e.g., on the order of about 3 nm to about 30 nm in thickness and typically from about 5 nm to about 15 nm), which is also referred to as a fully depleted SOI device as opposed the partially depleted SOI device of FIG. 1. An ultra thin SOI layer may improve short channel effects due to a reduced amount of body charge controlled by drain bias in comparison to the body charge controlled by the gate bias. For such a configuration, the reduction of short channel effects becomes significant when SOI thickness is reduced to below 15 nm and particularly below 10 nm. Unfortunately, for such thin SOI layers, a close proximity of various scattering centers present at the BOX/SOI interface to the transistor channel substantially affect electronic transport of the inversion charge reducing channel mobility and degrading transistor "on" current.

Further, a very thin SOI layer results in an increased series resistance between the source/drain silicide layer 116 and the transistor channel, and typically requires a raised source/drain structure as shown in FIG. 2. In addition, a very thin SOI layer typically results in a substantial reduction of the channel mobility gain coming from mechanical stressors (not shown) often present in the source and drain regions 112, 114 due to a smaller available volume in these regions in the proximity of transistor body 107.

On one hand, the junction capacitance of the MOSFET 200 is reduced with respect to that of FIG. 1, due to the reduced body thickness and absence of heavy halo implantations. Along the same lines, the "inner fringe" capacitance ($C_{if}$) is also reduced because there is a reduced source/drain perimeter associated with the reduced body thickness. However, this is more than offset by an increased "outer fringe" capacitance ($C_{of}$) as a result of the raised source/drain configuration of MOSFET 200. In order to prevent full silicidation of such ultra thin SOI layer and an increase in channel to source/drain series resistance, additional silicon thickness is present adjacent to the nitride spacers 130. This structure is known in the art as the raised source/drain (RSD) and is formed by selective epitaxy process. This therefore increases the value of $C_{of}$ with respect to FIG. 1, and to an extent that surpasses the decrease in $C_{if}$ and $C_j$.

Figure 3:
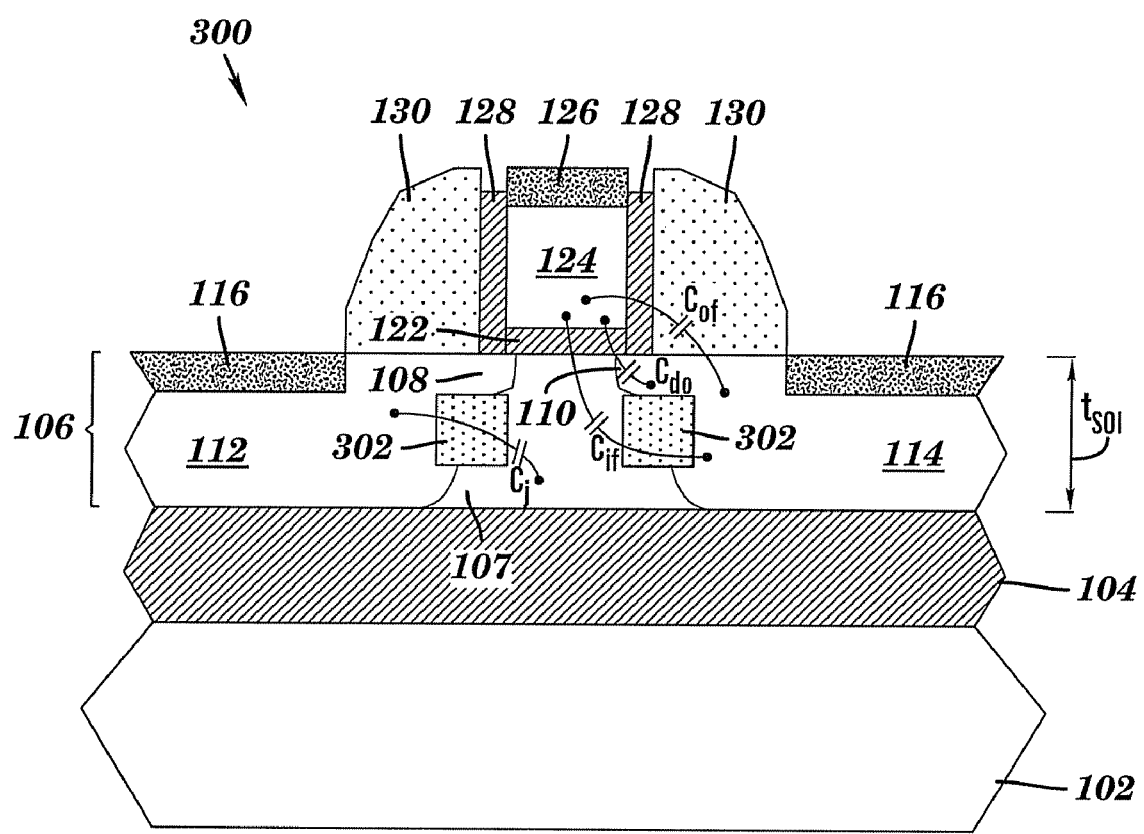
FIG. 3 is a cross sectional view of a MOS transistor having a dielectric halo plug, formed in accordance with an embodiment of the invention.

Therefore, in accordance with an embodiment of the invention, FIG. 3 is a cross sectional view of a MOS transistor 300 having dielectric plug regions or halos 302 formed therein. As is shown, the plugs are aligned with the outer edges of the gate 124, and are located in a manner that reduces the junction area between the source 112 and body 107, as well as the drain 114 and body 107. In terms of alignment, the plugs 302 may have an overlap with respect to the gate 124 by about 5 nm or less, or may have an underlap with respect to the gate 124 by about 15 nm or less.

Although the exemplary embodiment of the MOSFET 300 is depicted as an SOI device, the dielectric plugs 302 can also be used for transistor devices formed on bulk silicon. Moreover, while "halo" doped regions are not illustrated in FIG. 3 (as is the case for the device of FIG. 1), angled halo ion implantation or other techniques could also be used to produce these "halo" doped regions for further reducing short channel effects. In addition, the inventive dielectric plugs may further contain dopants suitable for forming (or assisting in forming) such "halo" doped regions (e.g., boron and arsenic dopants in the case of NFET and PFET halo structures, respectively).

The dielectric plugs can also be placed directly atop of the buried oxide layer 104. Such a configuration has an additional advantage of eliminating any residual leakage between the source and the drain along BOX and SOI interface.

The reduction of junction area (source/drain to body) resulting from the location of dielectric plugs 302 also serves to reduce the overall junction capacitance, in addition to the existing reduction versus bulk devices from the BOX 104. Because MOSFET 300 is still a partially depleted device with a relatively thick SOI layer, there is no increase in "outer fringe" capacitance ($C_{of}$) as would be the case in the raised source/drain device of FIG. 3. Furthermore, the "inner fringe" capacitance ($C_{if}$) is also reduced by the presence of the plugs 302, which becomes a more significant contribution to the total parasitic capacitance in a cutoff mode of the device, when the inversion charge is not yet created to isolate $C_{if}$.

Further, the presence of dielectric plugs 302 in between source/drain and transistor body 107 reduces the amount of depletion charge in the transistor body controlled by source/drain bias in comparison to the body depletion charge controlled by gate bias. In other words, the dielectric plugs 302 effectively shield the transistor body 107 from the electric field induced by source/drain bias, allowing for a better body charge control by the transistor gate. This leads to reduced short channel effects at fixed transistor geometry. This highly beneficial effect is even larger for dielectric plugs having a lower dielectric permittivity because the shielding effect is stronger for materials with a lower dielectric permittivity.

Accordingly, the plugs 302 with a relative dielectric permittivity (k) lower than that of silicon ($k_{Si}$=12) are preferred. An exemplary base dielectric material employed for the dielectric plugs 302 is silicon oxide ($SiO_x$) or oxynitride ($SiO_xN_y$) of varying but stable material compositions x and y such that its relative dielectric permittivity is from about 3.8 to about 7. A relatively large amount of hydrogen can be present in such material, but its presence is not essential for the present invention embodiments. Impurities such as dopant atoms may be added to the base material to assist in formation of doped halo regions as alluded above. The concentration of such impurities generally does not exceed 10 atomic percent.

Dielectric materials with k lower than that of silicon dioxide (k=3.9) are often referred to as "low-k" dielectrics. Dielectric plugs 302 comprised of a "low-k" material are particularly desirable. For instance, dielectric plugs 302 comprised of silicon oxide or oxynitride mixed with carbon and/or fluorine impurities have a dielectric permittivity lower than that of respective silicon oxide or oxynitride, and thus are highly preferred. Specifically, carbon doped silicon oxide or oxynitride is more highly preferred because it is more stable during high temperature processing than the fluorine doped silicon oxide or oxynitride. The percentage of carbon in such carbon doped oxide material can be from about 1 atomic percent to about 30 atomic percent, and more typically at about 15 atomic percent. Other high-temperature stable "low k" materials or structures (e.g., porous dielectrics, material structures with gaps, nanotubes, etc.) can also be employed for dielectric plugs 302. An extreme example of such a low-k structure is a plug 302 void of solid material with the value of k close to 1.

It is noted that the inventive transistor structure shown in FIG. 3 has relatively deep source and drain regions 112, 114 (similar to those shown in FIG. 1) while also providing capacitive and short channel advantages. This configuration also leaves sufficient volume in regions 112 and 114 for the use of efficient mechanical stressors therein. If desired, the thickness of SOI layer 106 can be beneficially increased without much capacitive penalty or adverse short channel effects to accommodate even larger mechanical stressors in regions 112 and 114.

The presence of mechanical stressors may place additional requirements onto the properties of plug material 302, as well as the plug geometry, to allow for an efficient mechanical stress transfer from mechanical stressors into the transistor body 107. Stiff materials with a large elastic modulus allow for a more efficient transfer of applied stress. Accordingly, the material selected for plug 302 is preferably a dielectric with a relatively high elastic modulus. As the plug material 302 replaces the SOI material, a dielectric material with a Young's elastic modulus equal to or higher than that of silicon is particularly advantageous. The Young's elastic modulus of crystalline silicon depends on the crystallographic direction and varies from about 130 GPa to about 190 GPa. Accordingly, a plug material with Young's elastic modulus equal to or higher than about 130 GPa is preferred.

The elastic modulus of the plug material 302 may be increased by increasing the number of strong covalent bonds such as Si—N and C—C bonds, for example. For instance, the elastic modulus of pure silicon nitride and diamond are about 380 GPa and 1000 GPa, respectively. An exemplary plug base material with substantial stiffness is silicon oxynitride ($SiO_xN_y$) with the nitrogen amount in excess of 30 atomic percent on average. The concentration of nitrogen in such material need not necessarily be uniform, thus permitting a layered oxide-nitride-oxide structure, for instance. Alternatively, the stiff plug may comprise a large amount of carbon-carbon bonding. This can be accomplished in a uniform fashion with carbon-carbon bonds distributed uniformly throughout the material or via a well-defined carbon-based inclusion (e.g., fullerenes, nanotubes, etc.).

Figure 4A:
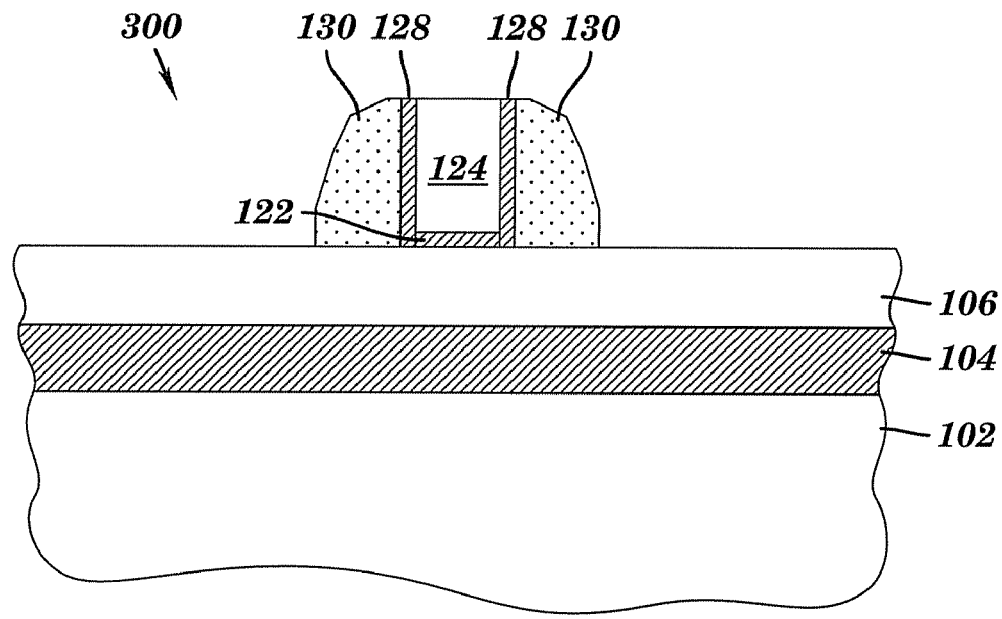
FIGS. 4(a) through 4(f) illustrate an exemplary process flow for forming the transistor shown in FIG. 3.

Referring now to FIGS. 4(a) through 4(f), there is shown an exemplary process flow for forming the dielectric plugs 302 in the transistor 300 shown in FIG. 3. Again, while the present example depicts an SOI device, the principles herein are equally applicable to bulk devices. In FIG. 4(a), the device 300 is illustrated at a stage of fabrication wherein the gate electrode 124 and gate oxide 122 are patterned, and spacers 128, 130 are formed. Although the source and drain regions have not yet been defined, the process could also be applied after all or some standard device doping and dopant activation steps (e.g., doping and/or activating shallow extension regions, halo implants, deep source/drain diffusions). In the present example, the source and drain regions are not yet defined. Thus, spacers 130 are considered to be purely sacrificial in this example, in that they are not the actual spacers to be used in the source/drain ion implantation step. However, the spacers 130 are of comparable geometry to the actual spacers that are used during the diffusion implantation, and they could be used to first define source/drain diffusion regions (including dopant activation by rapid thermal annealing if needed) in alternative embodiments.

Figure 4B:
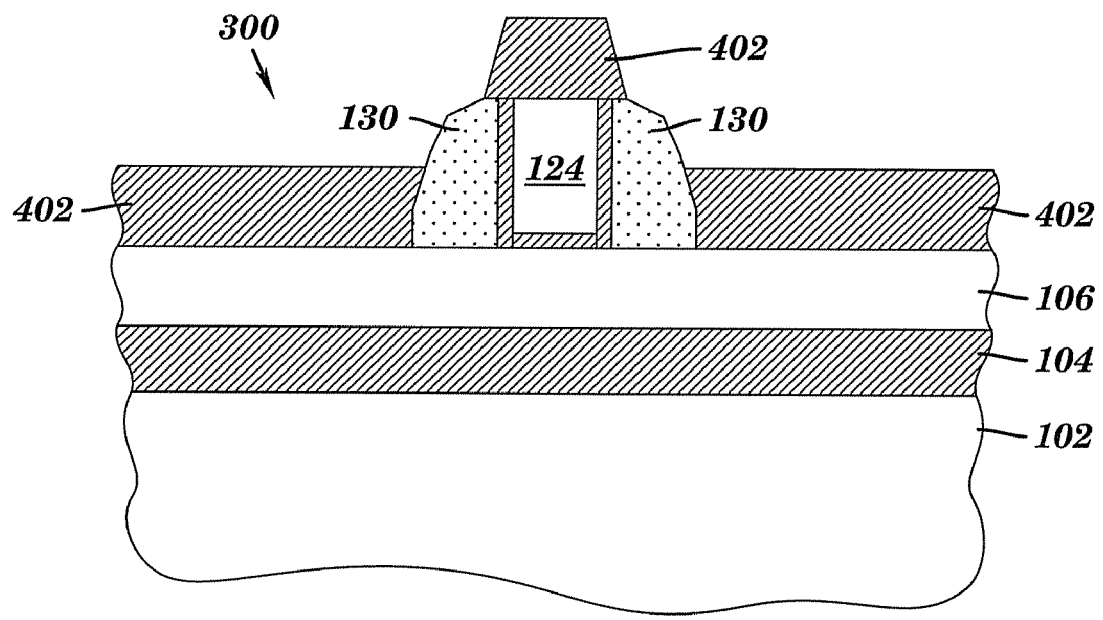

As shown in FIG. 4(b), a non-conformal film 402, such as a high density plasma (HDP) oxide for example, is deposited over device 300. The non-conformal oxide film 402 is used as a protective, self-aligned mask for the subsequent removal of the sacrificial spacers 130 and formation of dielectric plugs 302. In an HDP deposition process, the substrate is biased with respect to the plasma, resulting in a controlled bombardment of the substrate surface with energetic ions. By selecting a proper substrate bias, the deposition rate may be enhanced by ion bombardment, thus resulting in a higher deposition rate on more horizontally oriented surfaces (as opposed to more vertically oriented surfaces) and leading to a suitable non-conformal film 402. Alternatively, a spin-on material such as spin-on glass or spin-on polymer can be used to form a suitable non-conformal oxide-based or polymer-based film. The non-conformal polymer film can be combined with a conformal oxide film (deposited prior to spinning on polymer) to yield a composite oxide-polymer film suitable for this application.

Figure 4C:
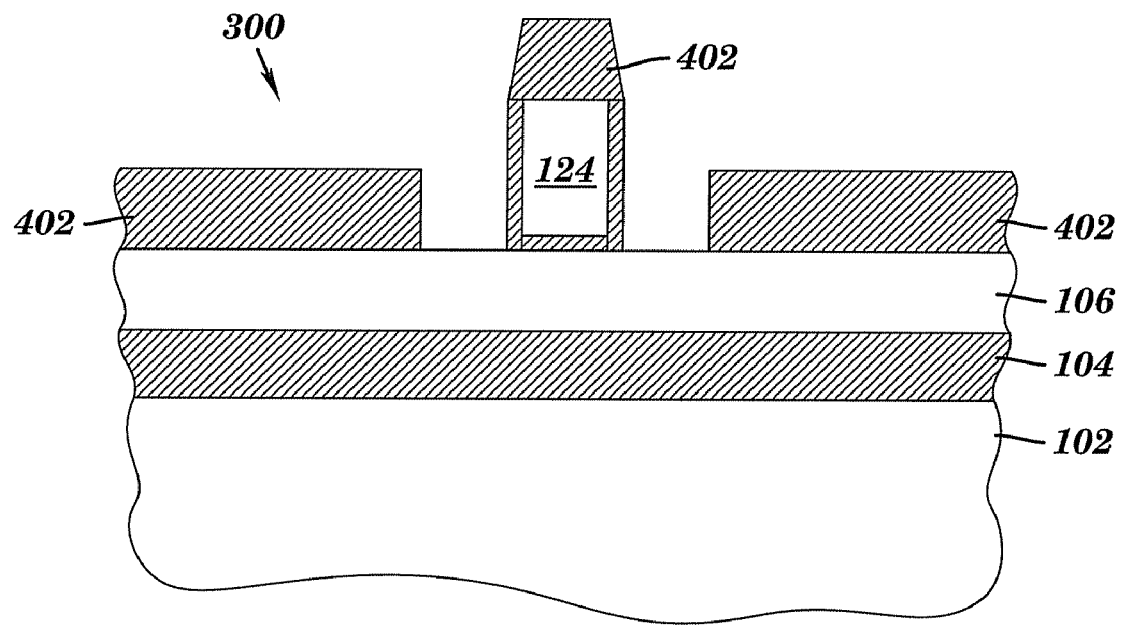

Following the initial deposition of the non-conformal film 402, an etch back step may be desired to expose the surface of the spacers 130 on which small amounts of non-conformal film were formed. In the case of oxide-based film 402, the etch back step can be performed in a solution of hydrofluoric acid while, in the case of polymer-based film 402, the etch back step is typically performed using reactive ion etching (RIE). Then, as shown in FIG. 4(c), an etch process is used to selectively remove the spacer material (e.g., nitride) with the non-conformal film 402 on horizontal surfaces remaining substantially intact. In the specific embodiment of an oxide mask 402 and nitride spacers 130, the selective nitride etch step is conducted using wet etching in hot phosphoric acid or, alternatively, dry etching in an RIE apparatus. In the specific embodiment of a polymer-based mask 402, the selective nitride etch step is conducted using RIE. This exposes the surface of SOI layer 106 directly beneath the areas corresponding to the removed spacers.

Figure 4D:
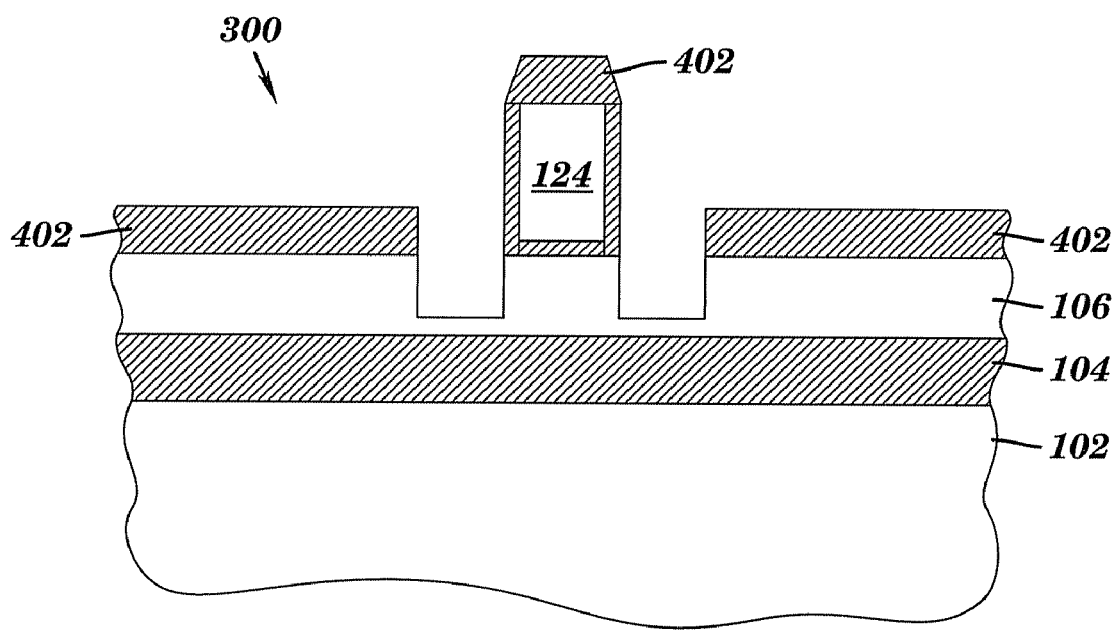

Then, a second etch is then employed to remove the exposed portions of the SOI layer 106 corresponding to the desired location of the dielectric plugs, as shown in FIG. 4(d). This silicon etch is a directional reactive ion etch, and may be conducted in two distinct steps. The first step is a non-selective RIE step that etches both silicon and silicon oxide at similar rates. This step is used to clear any residual silicon oxide present on exposed surfaces of the SOI layer underneath removed spacers. The second step is a selective RIE that etches silicon much faster than it does silicon oxide. Further, the directionality of the RIE process can be slightly adjusted during the process in order to enlarge the bottom portion of etched trench to better align it with the edge of conductive gate material 124. This is accomplished by introducing an isotropic component into an otherwise highly anisotropic directional reactive ion etch. An overlap of more than 5 nm between the edge of plug 302 and the edge of conductive gate 124 is not desirable. It will also be noted that this etch thins down the hard mask material 402, as depicted in FIG. 4(d).

Although in the illustrated embodiment, the depth of the second etch does not extend completely through the thickness of the SOI layer 106, such could be the case if desired. Stated another way, the dielectric halos could be configured to be in direct contact with the BOX layer 104. In addition to providing reduced junction capacitance, this variation would also result in the ability to use the BOX layer 104 as an etch stop, thereby providing a device processing advantage. Further, the depth of the second etch can be endpointed utilizing optical emission response from the marker atoms present in SOI layer at a predetermined depth and excited by plasma in the etch chamber. A small dose of marker atoms (e.g., carbon) can be implanted into the SOI layer with their peak at a preselected depth. Small amounts of such marker atoms do not interfere with device formation or operation but provide a means for effective etch end pointing.

Figure 4E:
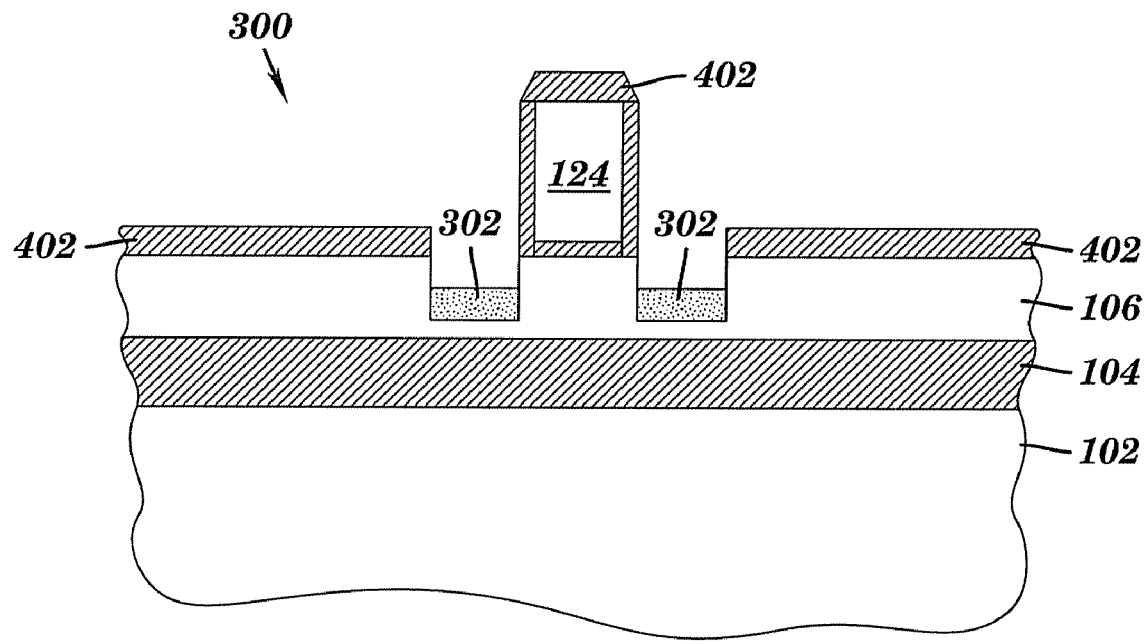

Regardless of the selected depth of the SOI etch, FIG. 4(e) illustrates the subsequent formation of the dielectric plug/halo material 302 within the openings defined in the SOI layer 106. Prior to dielectric material deposition, all polymer films are removed. Optionally, the exposed silicon trench walls are then oxidized (or oxynitridized) to form a thin layer of high quality silicon oxide or oxynitride. The deposition process for the plug/halo material 302 may be, for example, a conformal chemical vapor deposition (CVD) and modifications thereof, such as atomic layer or pulsed CVD, plasma assisted CVD (PECVD). In one example of a silicon oxide CVD, the silicon precursor is TEOS (tetraethylorthosilicate) and the oxygen precursor is ozone.

This CVD process is conducted at wafer temperature of about 480° C. and at a reduced pressure of below 200 Torr. Dopants can be also introduced into the conformal oxide film by adding a desired precursor to the deposition mixture. Other additives may be also introduced into plug material 302 by adding respective chemical precursors into the deposition mixture. For instance, nitrogen, carbon, and fluorine can be added by introducing ammonia ($NH_3$), methane ($CH_4$), and nitrogen fluoride ($NF_3$), respectively. In certain cases, additional precursors are chemical stable at the deposition temperature and require the use of plasma to assist in molecular bond breaking. Alternatively, the material 302 can be a spin-on dielectric or an HDP deposited material. If the entire trench is initially filled with the dielectric material 302, then an etch back step is used to recess the dielectric material down to a level corresponding to the top of the plugs. In one example, the etch back process has a variable degree of directionality to preserve material 128 on the gate walls and mask 402 on horizontal surfaces. Due to a high aspect ratio of the etched trench, the target deposition thickness is about half of the trench width, and is typically less than about 15 nm. It is noted that the etch back process further thins down the hard mask material 402, as also depicted in FIG. 4(e).

Figure 4F:
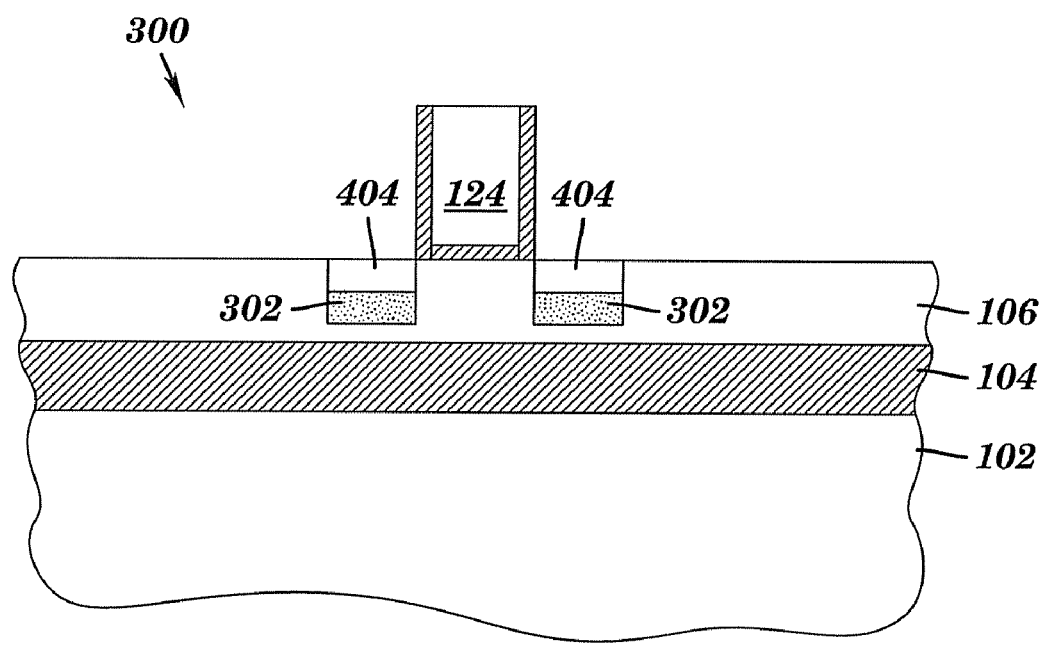

Then, as shown in FIG. 4(f), the regions above the newly defined dielectric plugs are filled with additional crystalline silicon 404, such as through selective epitaxial growth for example. Selective epitaxy allows for the growth of crystalline silicon on crystalline surfaces but not on dielectric surfaces. During the prior etch back process and/or epitaxial preclean process, the walls of the recessed trench above the dielectric plug are cleaned up of any native oxide while preserving amorphous material around the gate structure and on the horizontal surfaces of the substrate. The epitaxial preclean can include an in-situ hydrogen bake at about 800° C. at reduced pressure of about 80 Torr to further remove any remains of the native oxide which may be present on exposed silicon surfaces. In this geometry, the epitaxial process results in so called lateral crystal overgrowth. The quality of such laterally overgrown crystal degrades quickly away from the interface. Hence, it is highly preferred that the trench width is less than the opening depth. A typical opening depth is about 20-25 nm to ensure low series resistance of source and drain extension regions 108, 110 located above the dielectric plugs 302. Accordingly, an exemplary plug width is from about 3 nm to about 25 nm; an exemplary plug height is from about 10 nm to about 150 nm; and an exemplary plug depth with respect to the SOI surface is from about 10 nm to about 30 nm. It is noted that any residual epitaxial defects and imperfections are fully contained within highly doped source and drain regions 108, 110, 112, 114, resulting no substantial adverse effects on the device performance and operation.

Figure 5A:
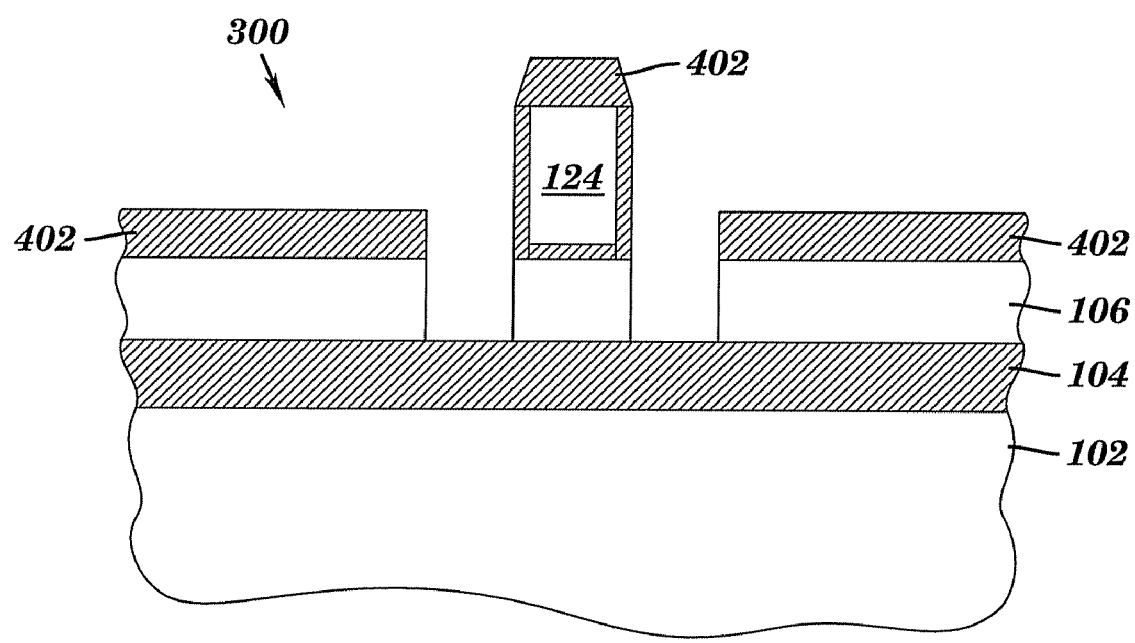
FIGS. 5(a) through 5(c) illustrate an alternative process flow for FIGS. 4(d) through 4(f), in which the dielectric halo is formed directly atop a buried oxide layer for a silicon-on-insulator device.
Figure 5B:
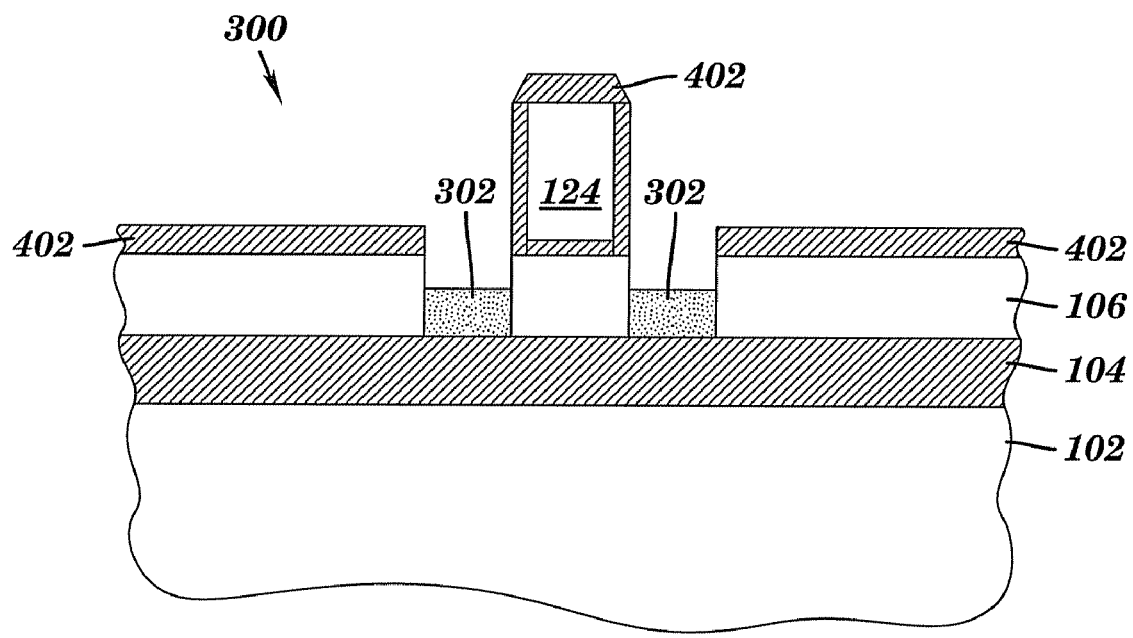
Figure 5C:
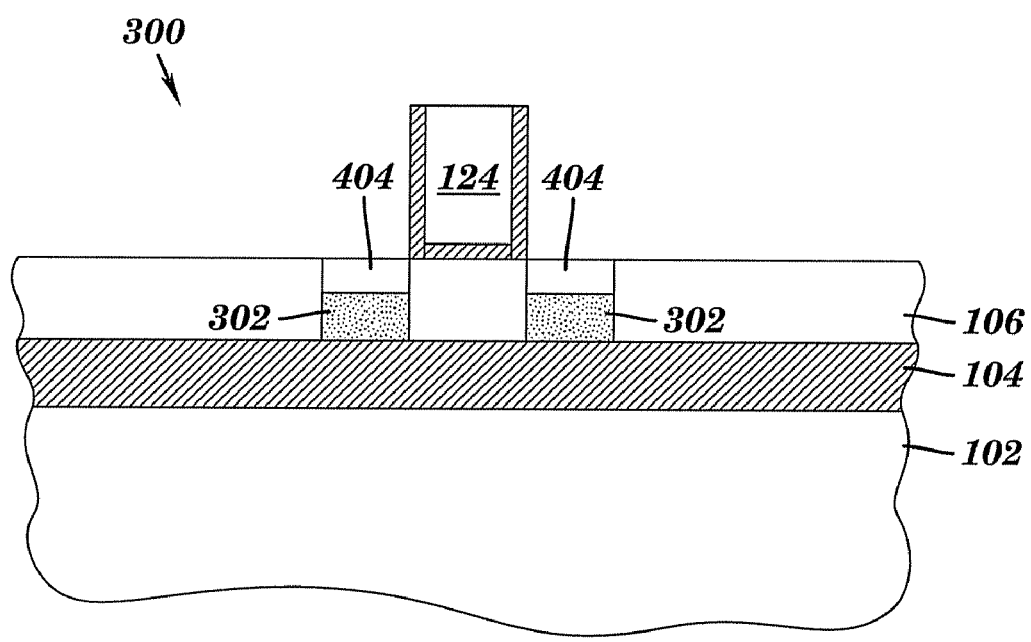

Thus configured, the device 300 is ready for further processing according to existing processes (e.g., new spacer formation, shallow extension implants, halo implants, deep source drain implants, mechanical stressors). Again, the dielectric halo 302 (plugs) could also be formed atop a BOX layer 104 for an SOI device, as shown in the sequence of FIGS. 5(a) through 5(c).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a field effect transistor (FET) device, comprising:
   forming a gate conductor and a gate dielectric on an active device area of a semiconductor substrate;
   forming a drain region in said active device area of said semiconductor substrate, on one side of said gate conductor;
   forming a source region in said active device area of said semiconductor substrate, on an opposite side of said gate conductor; and
   forming a dielectric halo in said active area of said semiconductor substrate, said dielectric halo disposed in contact between said drain region and a body region and in contact between said source region and said body region, wherein said forming a dielectric halo further comprises forming sacrificial spacers adjacent said gate conductor and said gate dielectric, forming a non-conformal mask layer over said semiconductor substrate and said gate conductor, removing said sacrificial spacers so as to expose a portion of semiconductor substrate, removing portions of said semiconductor substrate exposed by the removal of said sacrificial spacers; and forming a dielectric material within openings defined by said removal of portions of said semiconductor substrate so as to define a pair of dielectric plugs disposed below a channel of the FET device.

2. The method for forming an FET device according to claim 1, further comprising forming an additional substrate material over a dielectric material used in forming said dielectric halo.

3. The method for forming an FET device according to claim 2, wherein said forming said additional substrate material over said dielectric material further comprises selective epitaxial growth of said substrate material over said dielectric material.

4. The method for forming an FET device according to claim 2, wherein said active device area is formed within a silicon-on-insulator (SOI) layer of said semiconductor substrate.

5. The method for forming an FET device according to claim 4, wherein a buried oxide (BOX) of said semiconductor substrate is used as an etch stop layer during said removal of portions of said substrate.

* * * * *